US010247157B2

(12) United States Patent
Lukitsch et al.

(10) Patent No.: US 10,247,157 B2
(45) Date of Patent: Apr. 2, 2019

(54) DIAMOND LIKE CARBON (DLC) COATING FOR ETHANOL-BLENDED FUEL INJECTOR APPLICATIONS

(71) Applicant: GM Global Technology Operations LLC, Detroit, MI (US)

(72) Inventors: Michael J. Lukitsch, Marysville, MI (US); Zhongyi Liu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/422,074

(22) Filed: Feb. 1, 2017

(65) Prior Publication Data

US 2018/0216593 A1    Aug. 2, 2018

(51) Int. Cl.
*C09D 1/00* (2006.01)
*C23C 14/06* (2006.01)
(Continued)

(52) U.S. Cl.
CPC ............ *F02M 61/166* (2013.01); *C09D 1/00* (2013.01); *C09D 7/61* (2018.01); *C23C 14/0641* (2013.01);
(Continued)

(58) Field of Classification Search
CPC .... C09D 7/61; C09D 7/63; C90D 1/00; C23C 30/00; C23C 28/322; C23C 28/042;
(Continued)

(56) References Cited

U.S. PATENT DOCUMENTS 5,551,959 A * 9/1996 Martin .................. B24D 3/004
51/295
6,802,457 B1 * 10/2004 Campion .............. C23C 14/025
239/533.2
(Continued)

FOREIGN PATENT DOCUMENTS

CN      108374741 A      8/2018
DE   102018102073 A1    8/2018

OTHER PUBLICATIONS

Tomasz Liskiewicz; "DLC Coatings in Oil and Gas Production"; http://www.slideshare.net/TomaszLiskiewicz/dlc-coatings-in-oil-and-gas-production; downloaded Jan. 18, 2017; 2 pages.

*Primary Examiner* — George C Jin
(74) *Attorney, Agent, or Firm* — Harness, Dickey & Pierce, P.L.C.

(57) ABSTRACT

A vehicle part or component includes a surface that is configured to contact a fuel containing ethanol. The surface has a layer of non-hydrogenated diamond like carbon (NH-DLC) material disposed on the surface. The layer of NH-DLC has a thickness of from greater than or equal to about 100 nm to less than or equal to about 100 μm. The NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%. The NH-DLC material is substantially free of hydrogen atoms. Methods for manufacturing the vehicle part or component are also provided.

20 Claims, 3 Drawing Sheets

(51) Int. Cl.
*F02M 61/16* (2006.01)
*C09D 7/61* (2018.01)

(52) U.S. Cl.
CPC . *C23C 14/0617* (2013.01); *F02M 2200/9038* (2013.01); *F02M 2200/956* (2013.01)

(58) Field of Classification Search
CPC .............. C23C 28/3455; C23C 28/044; C23C 28/321; C23C 28/34; C23C 28/341; C23C 28/345; C23C 14/025; C23C 14/0611; C23C 14/0635; C23C 14/0641; C23C 14/0617
See application file for complete search history.

(56) References Cited

U.S. PATENT DOCUMENTS

| | | | |
|---|---|---|---|
| 2004/0251478 A1* | 12/2004 | Dahl | B82Y 10/00 257/232 |
| 2005/0089685 A1* | 4/2005 | Hamada | C10M 169/04 428/408 |
| 2006/0145398 A1* | 7/2006 | Bailey | B29C 33/58 264/338 |
| 2007/0096057 A1* | 5/2007 | Hampden-Smith | C09D 11/322 252/301.16 |
| 2008/0132047 A1* | 6/2008 | Dunne | H01L 21/0455 438/527 |
| 2008/0220257 A1* | 9/2008 | Dekempeneer | C23C 16/0272 428/408 |
| 2009/0078906 A1* | 3/2009 | Shafer | F02M 61/18 251/368 |
| 2010/0129644 A1* | 5/2010 | Endrino | C23C 30/00 428/336 |
| 2016/0169180 A1* | 6/2016 | McAlister | F02M 51/0603 123/472 |
| 2016/0207825 A1* | 7/2016 | Black | C03C 21/002 |
| 2016/0230274 A1* | 8/2016 | Flannery | C23C 28/32 |
| 2017/0321645 A1* | 11/2017 | Liu | F02M 61/166 |

* cited by examiner

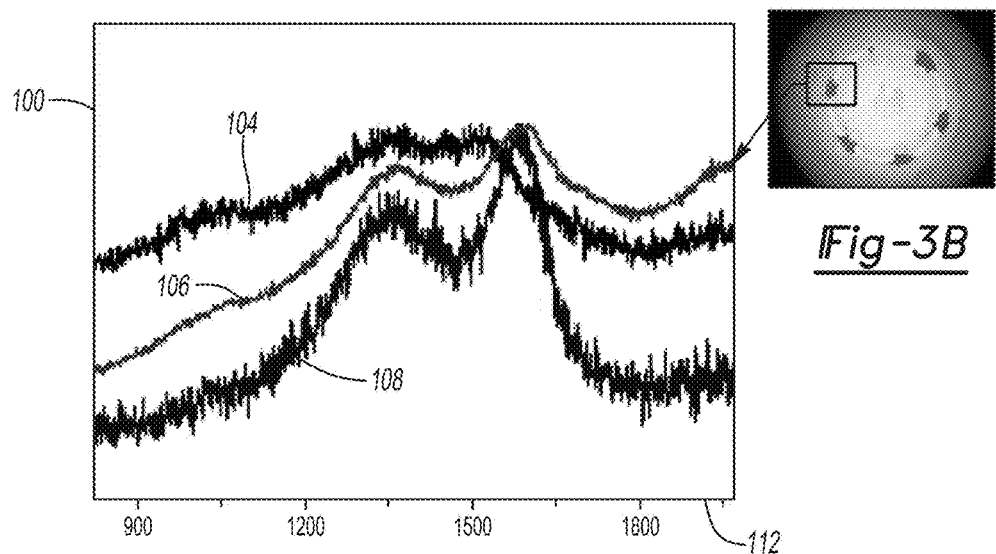
Fig-3A
Fig-3B
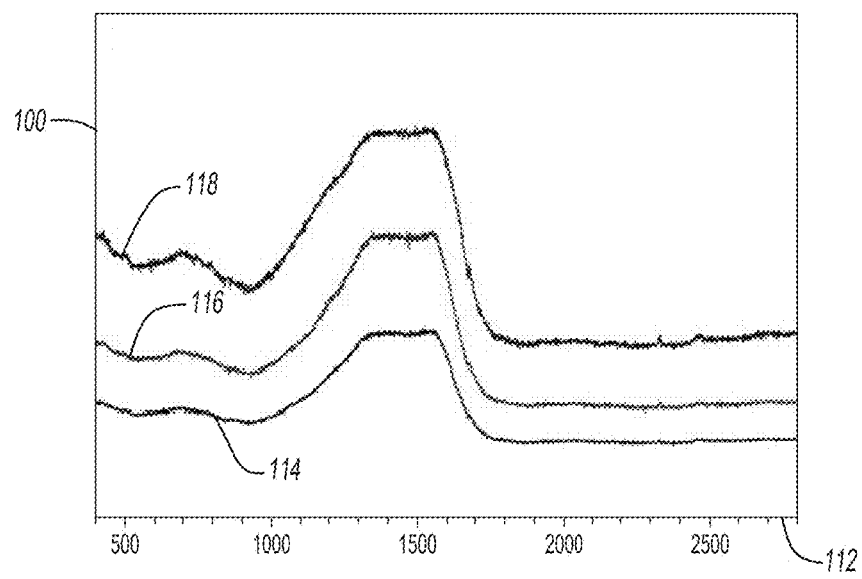
Fig-4

DIAMOND LIKE CARBON (DLC) COATING FOR ETHANOL-BLENDED FUEL INJECTOR APPLICATIONS

INTRODUCTION

This section provides background information related to the present disclosure which is not necessarily prior art.

Vehicles powered by internal combustion engines have a fuel delivery system that stores and delivers fuels to the internal combustion engines. In general, the fuel system includes units that include a fuel tank, a fuel pump, a fuel filter, a sending unit, a fuel rail, fuel injectors, and a series of conduits that transports fuel between the units. Because various units of the fuel system contact fuel, some at elevated temperatures, the units must be capable of withstanding thermal-induced and/or fuel-induced corrosion.

Many vehicles have internal combustion engines that are powered at least partially, if not completely, by alternative fuels, which help reduce petroleum use and greenhouse gas emissions. Some vehicles, i.e., flexible-fuel vehicles or dual-fuel vehicles (also known as "flex-fuel vehicles") have internal combustion engines that are designed to run on more than one fuel, such as a blend of gasoline and an alternative fuel.

One such alternative fuel is ethanol, which may be generated from corn, grain, or other biomass sources. Whereas some vehicles have internal combustion engines that run on pure 100% ethanol, i.e., E100 fuels, other vehicles have internal combustion engines that run on ethanol blended fuels, such as E5 (5% ethanol), E7 (7% ethanol), E10 (10% ethanol), E20 (20% ethanol), E22 (22% ethanol), E25 (25% ethanol), E70 (70% ethanol), E75 (75% ethanol), E85 (85% ethanol), or E95 (95% ethanol) fuels. Because ethanol causes corrosion on various materials, vehicle components, such as units of fuel delivery systems, that contact fuels containing ethanol benefit from coatings that resist corrosion. With the increasing use of fuels containing ethanol throughout the world, there is a need for new coatings that withstand corrosion caused by ethanol or a combination of ethanol and heat.

SUMMARY

This section provides a general summary of the disclosure, and is not a comprehensive disclosure of its full scope or all of its features.

The current technology provides a vehicle component that includes a surface that is configured to contact a fuel containing ethanol, and a layer of non-hydrogenated diamond like carbon (NH-DLC) material disposed on the surface, the layer having a thickness of from greater than or equal to about 100 nm to less than or equal to about 100 µm. The NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%. The NH-DLC material is substantially free of hydrogen atoms.

In various embodiments, the component is composed of a steel alloy or a ceramic.

In various embodiments, the NH-DLC material does not include any hydrogen atoms.

In various embodiments, the NH-DLC material has a carbon-carbon $sp^3$ hybrid bond content of from greater than or equal to about 80% to less than or equal to about 100%.

In various embodiments, the NH-DLC material has a carbon-carbon $sp^2$ hybrid bond content of from greater than or equal to about 0% to less than or equal to about 20%.

In various embodiments, the NH-DLC material includes a dopant.

In various embodiments, the layer of NH-DLC material has a thickness of from greater than or equal to about 1 µm to less than or equal to about 25 µm.

In various embodiments, the NH-DLC material further includes from greater than 0 at. % to less than or equal to about 10 at. % of a doping material, the doping material selected from the group consisting of calcium (Ca), zinc (Zn), iron (Fe), boron (B), tungsten (W), platinum (Pt), gold (Au), silver (Ag), copper (Cu), chromium (Cr), aluminum (Al), titanium (Ti), nitrogen (N), phosphorous (P), silicon (Si), and combinations thereof.

In various embodiments, the vehicle component is a fuel injector, an intake valve, an exhaust valve, a cylinder, a piston, a spark plug, a fuel pump, a sending unit, a fuel tank, or a combination thereof.

In various embodiments, the vehicle component is a fuel injector part selected from the group consisting of an injection nozzle, a valve, a valve needle, a valve seat, a ball, and combinations thereof.

The current technology also provides a fuel injector including a housing having an injection nozzle in communication with a fuel injection assembly, the injection nozzle including a valve seat, a discharge orifice, and an injection valve disposed against the valve seat, the fuel injection assembly being configured to move the injection valve away from the valve seat to allow fuel containing ethanol to flow through the injection nozzle, wherein at least a portion of a surface of at least one of the injection nozzle, the valve seat, the discharge orifice, and the injection valve includes a layer of non-hydrogenated diamond like carbon (NH-DLC) material. The NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%. The NH-DLC material is substantially free of hydrogen atoms.

In various embodiments, the NH-DLC material does not include any hydrogen atoms.

In various embodiments, the layer of NH-DLC material has a thickness of from greater than or equal to about 100 nm to less than or equal to about 100 µm.

In various embodiments, the fuel containing ethanol includes greater than or equal to about 1% by volume ethanol.

In various embodiments, the at least a portion of the fuel injector including the layer of NH-DLC material is inert to thermal and corrosive damage resulting from the fuel containing ethanol.

In various embodiments, the surface is configured to contact fuel containing ethanol.

The current technology also provides a method of protecting a vehicle component from thermal and corrosive damage resulting from contact with fuel containing ethanol. The method includes disposing a layer of non-hydrogenated diamond like carbon (NH-DLC) material to a surface of a vehicle component that is configured to contact fuel containing ethanol, and contacting the surface of the vehicle part having the layer of NH-DLC material to fuel containing ethanol. The NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%. The NH-DLC material is substantially free of hydrogen atoms.

In various embodiments, the vehicle component is a fuel injector, an intake valve, an exhaust valve, a cylinder, a piston, a spark plug, a fuel pump, a sending unit, a fuel tank, or a combination thereof.

In various embodiments, the disposing is performed by filtered cathodic vacuum arc, ion beam deposition, plasma enhanced chemical vapor deposition, pulsed laser deposition, or plasma immersion ion implantation.

In various embodiments, the disposing a layer includes disposing a layer of NH-DLC having a thickness of from greater than or equal to about 100 nm to less than or equal to about 100 µm to a surface of a vehicle component.

DRAWINGS

The drawings described herein are for illustrative purposes only of selected embodiments and not all possible implementations, and are not intended to limit the scope of the present disclosure.

FIG. 3A shows Raman spectroscopy results obtained from vehicle components comprising a layer of hydrogenated-diamond like carbon;

FIG. 3B is a micrograph showing corrosion in a hydrogenated-diamond like carbon layer disposed on a vehicle part; and FIG. 4 shows Raman spectroscopy results obtained from vehicle components comprising a layer of non-hydrogenated-diamond like carbon.

Corresponding reference numerals indicate corresponding parts throughout the several views of the drawings.

DETAILED DESCRIPTION

Figure 1:
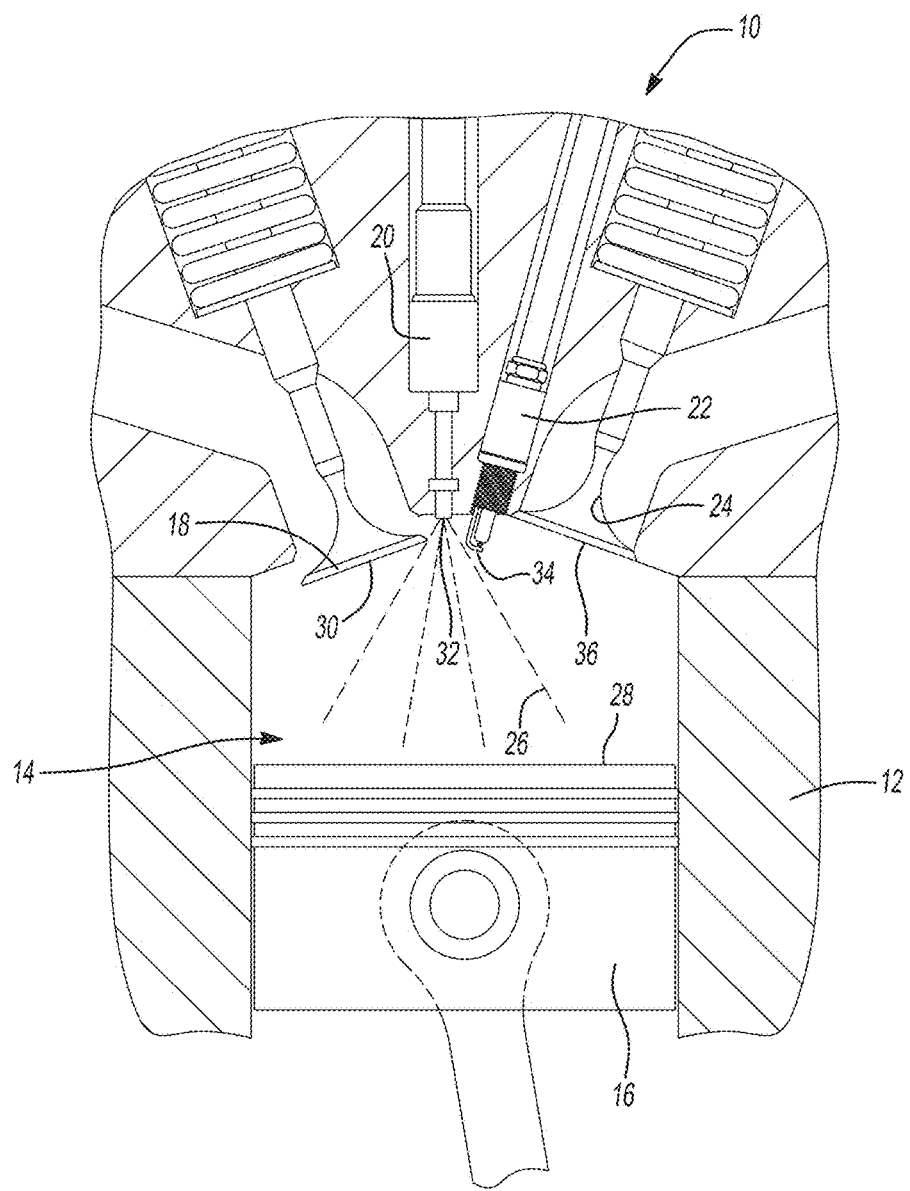
FIG. 1 shows an illustration of a cross section of an internal combustion engine.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated. In addition, disclosure of ranges includes disclosure of all values and further divided ranges within the entire range, including endpoints and sub-ranges given for the ranges.

Example embodiments will now be described more fully with reference to the accompanying drawings.

Diamond like carbon (DLC) is a carbon-based material comprising a network of carbon-carbon $sp^2$ hybrid bonds, carbon-carbon $sp^3$ hybrid bonds, or both carbon-carbon $sp^2$ hybrid bonds and carbon-carbon $sp^3$ hybrid bonds. When both $sp^2$ and $sp^3$ bonds are present, the lower a carbon-carbon $sp^3$ hybrid bond:carbon-carbon $sp^2$ hybrid bond ratio (or higher $sp^2$%), the more graphite-like the DLC material becomes. Conversely, the higher the carbon-carbon $sp^3$ hybrid bond:carbon-carbon $sp^2$ hybrid bond ratio (or higher $sp^3$%), the more diamond-like the DLC material becomes.

According to the present technology, a DLC material that contains a high hydrogen content, i.e., a hydrogen content of greater than about 40 atomic % (at. %) is referred to as hydrogenated DLC (H-DLC), wherein "at. %" refers to a percent of total atoms in the DLC material. Vehicle components having surfaces coated with H-DLC materials that contact fuels containing ethanol are subject to corrosion.

Conversely, DLC material that contains a low hydrogen content, i.e., a hydrogen content of less than or equal to about 40 at. % is referred to as non-hydrogenated-DLC (NH-DLC). Accordingly, the NH-DLC material of the current technology has a hydrogen content of greater than or equal to 0 at. % to less than or equal to about 40 at. %, less than or equal to about 30 at. %, less than or equal to about 20 at. %, less than or equal to about 10 at. %, less than or equal to about 5 at. %, or less than or equal to about 1 at. %. Therefore, NH-DLC materials have a hydrogen content of greater than or equal to about 0 at. % to less than or equal to about 40 at. %. In various aspects of the current technology, the NH-DLC material is substantially free of hydrogen, wherein "substantially free of hydrogen" means that hydrogen atoms are absent to the extent that undesirable and/or detrimental effects attendant with its presence are avoided. In certain embodiments, a NH-DLC material that is "substantially free" of hydrogen comprises less than about 1 at. % by weight of hydrogen in the material, optionally less than about 0.75 at. % by weight, optionally less than about 0.5 at. % by weight, optionally less than about 0.25 at. % by weight, optionally less than about 0.1 at. % by weight, optionally less than about 0.05 at. % and in certain embodiments, the material is free from any hydrogen and therefore comprises 0 at. % by weight hydrogen.

In various aspects of the current technology, the NH-DLC material comprises a carbon content of from greater than or equal to about 70 at. % to less than or equal to about 100 at. %. For example, the NH-DLC material can have a carbon content of greater than or equal to about 70 at. %, greater than or equal to about 75 at. %, greater than or equal to about 80 at. %, greater than or equal to about 85 at. %, greater than or equal to about 90 at. %, greater than or equal to about 95 at. %, or greater than or equal to about 99 at. %.

In various aspects of the current technology, the NH-DLC material comprises a carbon-carbon $sp^3$ hybrid bond content of greater than or equal to about 1%, greater than or equal to about 10%, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or greater than or equal to about 95% of the total number to $sp^3$ and $sp^2$ hybrid bonds, such as a carbon-carbon $sp^3$ hybrid bond content of from greater than or equal to about 1% to less than or equal to about 100%, greater than or equal to about 20% to less than or equal to about 100%, greater than or equal to about 30% to less than or equal to about 100%, greater than or equal to about 40% to less than or equal to about 100%, greater than or equal to about 50% to less than or equal to about 100%, greater than or equal to about 60% to less than or equal to about 100%, greater than or equal to about 70% to less than or equal to about 100%, greater than or equal to about 80% to less than or equal to about 100%, greater than or equal to about 90% to less than or equal to about 100%, or greater than or equal to about 95% to less than or equal to about 100%.

In various aspects of the current technology, the NH-DLC material comprises a carbon-carbon $sp^2$ hybrid bond content of greater than or equal to about 0%, greater than or equal to about 10%, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or greater than or equal to about 95% of the total number to $sp^3$ and $sp^2$ hybrid bonds, such as a carbon-carbon $sp^2$ hybrid bond content of from greater than or equal to about 0% to less than or equal to about 99%, greater than or equal to about 0% to less than or equal to about 95%, greater than or equal to about 0% to less than or equal to about 90%, greater than or equal to about 0% to less than or equal to about 80%, greater than or equal to about 0% to less than or equal to about 70%, greater than or equal to about 0% to less than or equal to about 60%, greater than or equal to about 0% to less than or equal to about 50%, greater than or equal to about 0% to less than or equal to about 40%, greater than or equal to about 0% to less than or equal to about 30%, greater than or equal to about 0% to less than or equal to about 20%, greater than or equal to about 0% to less than or equal to about 10%, greater than or equal to about 0% to less than or equal to about 5%, greater than or equal to about 0% to less than or equal to about 1%.

In various aspects of the current technology, the NH-DLC material comprises a carbon-carbon $sp^3$ hybrid bond:carbon-carbon $sp^2$ hybrid bond ratio of from greater than or equal to about 1:1000 to less than or equal to about 1000:1, of from greater than or equal to about 1:750 to less than or equal to about 750:1, of from greater than or equal to about 1:500 to less than or equal to about 500:1, of from greater than or equal to about 1:250 to less than or equal to about 250:1, of from greater than or equal to about 1:100 to less than or equal to about 100:1, of from greater than or equal to about 1:50 to less than or equal to about 50:1.

According to various aspects of the current technology, the NH-DLC material can be doped with a metal, metalloid, or nonmetal doping material to generate doped NH-DLC. The doping material is, for example, calcium (Ca), zinc (Zn), iron (Fe), boron (B), tungsten (W), platinum (Pt), gold (Au), silver (Ag), copper (Cu), chromium (Cr), aluminum (Al), titanium (Ti), nitrogen (N), phosphorous (P), silicon (Si), or a combination thereof. When present, the NH-DLC has a doping material concentration of from greater than 0 at. % to less than or equal to about 30 at. %, to less than or equal to about 20 at. %, to less than or equal to 10 at. %, or to less than or equal to about 5 at. %.

Ethanol-blended fuels and various fuel additives have corrosive properties and can damage vehicle components that they contact. Thermal stress also causes damage to vehicle components. Accordingly, the present technology provides vehicle components that are protected from thermal damage and corrosive damage resulting from contact with fuels comprising ethanol and/or fuels comprising corrosive additives. In particular, a layer or coating of NH-DLC is disposed on at least a portion of surfaces of vehicle components that contact ethanol-blended fuels. NH-DLC is thermally stable at temperatures emitted from running engines and has a low hydrogen content or no hydrogen content, which minimizes layer or coating defects due to H depletion, i.e., graphitization, and thus protects vehicle components form ethanol-blended fuel-induced and thermal-induced corrosion. The layer or coating of NH-DLC provides excellent thermal and chemical inertness to corrosive fluids and reduces friction and wear to vehicle components that are subjected to thermal stress and/or contact with corrosive fluids, such as ethanol-blended fuels and corrosive additives. Because the layer or coating of NH-DLC material protects against corrosion, which inhibits fuel leaks, emissions are also improved.

In various aspects of the current technology, the layer or coating of NH-DLC material disposed on the vehicle component surface that is configured to contact a fuel comprising ethanol has a thickness of from greater than or equal to about 100 nm to less than or equal to about 100 µm, from greater than or equal to about 500 nm to less than or equal to about 50 µm, or from greater than or equal to about 1 µm to less than or equal to about 25 µm. The layer or coating of NH-DLC withstands temperatures of less than or equal to about 450° C., of less than or equal to about 400° C., of less than or equal to about 350° C., or of less than or equal to about 300° C.

As used herein, "ethanol-blended fuels" are fuels that comprise ethanol. Therefore, ethanol-blended fuels include from greater than 0.5% ethanol by volume to less than or equal to 100% ethanol by volume. Ethanol blended fuels comprises less than 100% ethanol also comprise gasoline. Non-limiting examples of ethanol-blended fuels include ES (5% ethanol), E7 (7% ethanol), E10 (10% ethanol), E20 (20% ethanol), E22 (22% ethanol), E25 (25% ethanol), E70 (70% ethanol), E75 (75% ethanol), E85 (85% ethanol), E95 (95% ethanol), and E100 (100% ethanol) fuels.

Vehicles that have components that come in contact with ethanol-blended fuel are not limited. Nonetheless, exemplary vehicles include cars, trucks, recreational vehicles, motorcycles, scooters, boats, personal watercraft, tanks, and airplanes.

Various vehicle components that come in contact with ethanol-blended fuel during normal operation of a vehicle are shown in FIG. 1. FIG. 1 shows a cross-section of an exemplary internal combustion engine 10 that includes a portion of an engine block 12, a cylinder 14, a piston 16, an intake valve 18, a fuel injector 20, a spark plug 22, and an exhaust valve 24. After atomized ethanol-blended fuel 26 is introduced to the cylinder 14 by the fuel injector 20, the atomized ethanol-blended fuel 26 comes into contact at least with a portion of a first surface 28 of the piston 16, a second surface 30 of the intake valve 18, a third surface 32 of the fuel injector 20, a fourth surface 34 of the spark plug, and a fifth surface 36 of the exhaust valve. Therefore, disposing a layer of NH-DLC to a portion or all of the first surface 28, the second surface 30, the third surface 32, the fourth surface 34, and the fifth surface 36 protects the respective components from ethanol-blended fuel-induced corrosion. In various embodiments, the vehicle components comprise a steel alloy or a ceramic.

Ethanol-blended fuels are introduced to internal combustion engines by fuel delivery systems. Fuel delivery systems include a fuel tank, a fuel pump, a fuel filter, a sending unit, a fuel rail, fuel injectors, and a series of conduits that transports fuel between the units. Therefore, in various aspects of the current technology, at least a portion of these units that contact fuel comprising ethanol comprise a layer or coating of NH-DLC disposed thereon that protects the units from thermal and corrosive attack. The NH-DLC inhibits corrosion, which results in improved vehicle part efficiency relative to components that do not include layers of NH-DLC. For example, fuel rails and fuel injectors with NH-DLC disposed on portions that contact fuel comprising ethanol are protected from wear and can withstand high internal pressures.

Figure 2:
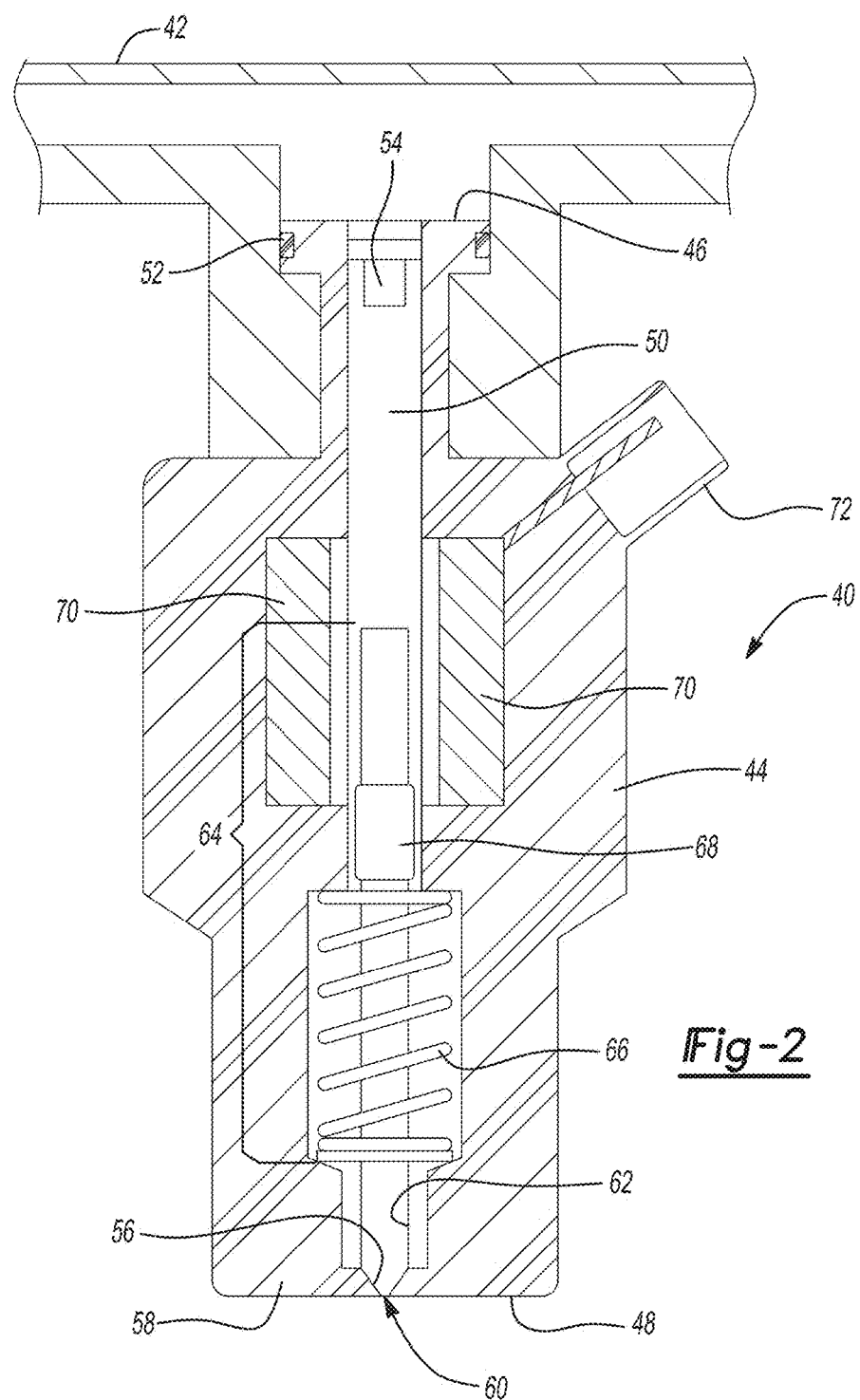
FIG. 2 shows an illustration of a cross section of a fuel injector prepared in accordance with certain aspects of the present disclosure.

Fuel injectors are particularly susceptible to corrosion from being subjected thermal stress and/or ethanol-blended fuels. Therefore, components of fuel injectors that have surfaces that contact ethanol-blended fuels benefit from having a layer or coating of NH-DLC disposed thereon. FIG. 2 shows a cross-section of an exemplary fuel injector 40 coupled to a fuel rail 42. The fuel injector 40 comprises a housing 44 that extends from a first fuel receiving end 46 to a second fuel injection end 48 that defines an internal bore 50 that extends form the first fuel receiving end 46 to the second fuel injection end 48. The first fuel receiving end 46 comprises an O ring 52 and a fuel filter 54. The second fuel injection end 48 comprises an injection nozzle 56 that includes a valve seat 58, a discharge orifice 60, and an injection valve 62 disposed against the valve seat 58. In various aspects of the current technology, injection valve 62 is a ball valve having a ball, such as a ball bearing, that is in moveable contact with a ball valve seat. The injection nozzle 56 is in communication with a fuel injection assembly 64 disposed within the bore 50. As shown in the exemplary fuel injector 40 of FIG. 2, the fuel injection assembly 64 includes a spring 66 that extends about a portion of the injection valve 62, a magnet 68 that is in communication with the injection valve 62, and an electromagnetic coil 70 that is located adjacent to the injection valve 62. During operation, fuel comprising ethanol is introduced into the fuel injector 40 at the first fuel receiving end 46 and fills the internal bore 50. The fuel injection assembly 64, which is powered through an electrical connector 72 that is in electrical communication with the electromagnetic coil 70, is configured to move the injection valve 62 away from the valve seat 58 to allow the fuel comprising ethanol to flow out of the orifice 60 of the injection nozzle 56 as an atomized gas. However, it is understood that various fuel injectors have parts that may differ from the exemplary fuel injector 40, such as, for example, by having a ball valve or different mechanical mechanisms that move the injector valve 62 away from the valve seat 58. In various aspects of the current technology at least a portion of at least one of the second fuel injection end 48, injection nozzle 56, the valve seat 58, the discharge orifice 60, and the injection valve 62 comprises a layer of NH-DLC that protects the fuel injector 40 from corrosion.

As discussed above, vehicle components comprising a layer of a NH-DLC material are protected from corrosion induced by ethanol-blended fuels and/or elevated temperatures. FIG. 3A shows Raman spectroscopy results obtained from a vehicle part comprising a layer of H-DLC. Spectra are plotted with a y-axis 100 representing intensity (arbitrary units; a.u.) and an x-axis 102 representing Ramn shift (wavelength; $cm^{-1}$). Spectrum 104 is taken from a vehicle component comprising a layer of H-DLC that has not been subjected to ethanol-blended fuels or elevated temperatures. Spectrum 106 is taken from a vehicle component comprising a layer of H-DLC that has been subjected to ethanol-blended fuels and elevated temperatures. As shown in FIG. 3B, the vehicle part shows signs of corrosion. Spectrum 108 is taken from a vehicle component comprising a layer of H-DLC that has not been subjected to ethanol-blended fuels, but has been subjected to an elevated temperature of about 200° C. for a period of time. Whereas spectrum 104 has a peak at about 1322 $cm^{-1}$, representative of a D band, and a peak at about 1518 $cm^{-1}$ representative of a G band, that overlap to form a plateau-like spectrum, spectrum 106 and spectrum 108 show pronounced peaks at the D band and the G band, with the G band shifting to a higher wave-number, 1581 $cm^{-1}$, relative to spectrum 104. Without being bound by theory, it is believed that $H_2$ desorption induced from contact with ethanol-blended fuel and/or elevated temperature causes the G band shift.

FIG. 4 shows Raman spectroscopy results obtained from a vehicle part comprising a layer of NH-DLC. Spectra are plotted with a y-axis 110 representing intensity (arbitrary units; a.u.) and an x-axis 112 representing Ramn shift (wavelength; $cm^{-1}$). Spectrum 114 is taken from a vehicle component comprising a layer of NH-DLC that has not been subjected to ethanol-blended fuels. Spectrum 116 is taken from a vehicle component comprising a layer of NH-DLC that has been subjected to E85 fuel. Spectrum 118 is taken from a vehicle component comprising a layer of NH-DLC that has been subjected to E100 fuel. Each of the spectra 114, 116, 118 show a broad peak between 1325 $cm^{-1}$ and 1560 $cm^{-1}$. None of the spectra 114, 116, 118 appear to have pronounced D bands or G bands, or a G band shift, which demonstrates corrosion inhibition by the layer of NH-DLC.

The current technology also provides a method of protecting a vehicle part from thermal and corrosive damage resulting from contact with fuel comprising ethanol. The method comprises disposing a layer of non-hydrogenated diamond like carbon (NH-DLC) to at least a portion of a surface of a vehicle part that is configured to contact fuel comprising ethanol, and contacting the at least a portion of the surface of the vehicle part having the layer of NH-DLC to fuel comprising ethanol. The vehicle part is a fuel injector, an intake valve, an exhaust valve, a cylinder, a piston, a spark plug, a fuel pump, a sending unit, a fuel tank, or a combination thereof. In various aspects of the current technology, the vehicle part is a component of a fuel injector described herein. The disposing is performed by filtered cathodic vacuum arc, ion beam deposition, plasma enhanced chemical vapor deposition, pulsed laser deposition, or plasma immersion ion implantation.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A vehicle component comprising:
    a surface of the component that is configured to contact a fuel comprising ethanol; and
    a layer of non-hydrogenated diamond-like carbon (NH-DLC) material disposed on the surface, the layer having a thickness of from greater than or equal to about 100 nm to less than or equal to about 100 μm,
    wherein the NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%, and wherein the NH-DLC material is substantially free of hydrogen atoms, and
    wherein the layer of NH-DLC material is configured to contact the fuel comprising ethanol.

2. The vehicle component according to claim 1, wherein the component comprises a steel alloy or a ceramic.

3. The vehicle component according to claim 1, wherein the NH-DLC material does not comprise any hydrogen atoms.

4. The vehicle component according to claim 1, wherein the NH-DLC material comprises a carbon-carbon $sp^3$ hybrid bond content of from greater than or equal to about 80% to less than or equal to about 100%.

5. The vehicle component according to claim 1, wherein the NH-DLC material comprises a carbon-carbon $sp^2$ hybrid bond content of from greater than or equal to about 0% to less than or equal to about 20%.

6. The vehicle component according to claim 1, wherein the NH-DLC material comprises a dopant.

7. The vehicle component according to claim 1, wherein the layer of NH-DLC material has a thickness of from greater than or equal to about 1 μm to less than or equal to about 25 μm.

8. The vehicle component according to claim 1, wherein the NH-DLC material further comprises from greater than 0 at. % to less than or equal to about 10 at. % of a doping material, the doping material selected from the group consisting of calcium (Ca), zinc (Zn), iron (Fe), boron (B), tungsten (W), platinum (Pt), gold (Au), silver (Ag), copper (Cu), chromium (Cr), aluminum (Al), titanium (Ti), nitrogen (N), phosphorous (P), silicon (Si), and combinations thereof.

9. The vehicle component according to claim 1, wherein the vehicle component is a fuel injector, an intake valve, an exhaust valve, a cylinder, a piston, a spark plug, a fuel pump, a sending unit, a fuel tank, or a combination thereof.

10. The vehicle component according to claim 1, wherein the vehicle component is a fuel injector part selected from the group consisting of an injection nozzle, a valve, a valve needle, a valve seat, a ball, and combinations thereof.

11. A fuel injector comprising:
    a housing having an injection nozzle in communication with a fuel injection assembly, the injection nozzle comprising a valve seat, a discharge orifice, and an injection valve disposed against the valve seat, the fuel injection assembly being configured to move the injection valve away from the valve seat to allow fuel comprising ethanol to flow through the injection nozzle, wherein at least a portion of a surface of at least one of the injection nozzle, the valve seat, the discharge orifice, and the injection valve comprises a layer of non-hydrogenated diamond like carbon (NH-DLC) material, wherein the NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%, and wherein the NH-DLC material is substantially free of hydrogen atoms, and wherein the layer of NH-DLC material is configured to contact the fuel comprising ethanol.

12. The fuel injector according to claim 11, wherein the NH-DLC material does not comprise any hydrogen atoms.

13. The fuel injector according to claim 11, wherein the layer of NH-DLC material has a thickness of from greater than or equal to about 100 nm to less than or equal to about 100 μm.

14. The fuel injector according to claim 11, wherein the fuel comprising ethanol comprises greater than or equal to about 1% by volume ethanol.

15. The fuel injector according to claim 11, wherein the at least a portion of the fuel injector comprising the layer of NH-DLC material is inert to thermal and corrosive damage resulting from the fuel comprising ethanol.

16. The fuel injector according to claim 11, wherein the surface is configured to contact fuel comprising ethanol.

17. A method of protecting a vehicle component from thermal and corrosive damage resulting from contact with fuel comprising ethanol, the method comprising:

disposing a layer of non-hydrogenated diamond like carbon (NH-DLC) material to a surface of a vehicle component that is configured to contact fuel comprising ethanol; and wherein the NH-DLC material has a carbon content of greater than or equal to about 90 atomic % (at. %), a carbon-carbon $sp^3$ hybrid bond content of from greater than or equal to about 60% to less than or equal to about 100%, and a carbon-carbon $sp^2$ hybrid bond content of from greater than or equal to about 0 to less than or equal to about 40%, and wherein the NH-DLC material is substantially free of hydrogen atoms, wherein the layer of NH-DLC material is configured to contact the fuel comprising ethanol.

18. The method according to claim 17, wherein the vehicle component is a fuel injector, an intake valve, an exhaust valve, a cylinder, a piston, a spark plug, a fuel pump, a sending unit, a fuel tank, or a combination thereof.

19. The method according to claim 18, wherein the disposing is performed by filtered cathodic vacuum arc, ion beam deposition, plasma enhanced chemical vapor deposition, pulsed laser deposition, or plasma immersion ion implantation.

20. The method according to claim 18, wherein the disposing a layer comprises disposing the layer of NH-DLC having a thickness of from greater than or equal to about 100 nm to less than or equal to about 100 pm to a surface of a vehicle component.

* * * * *